United States Patent
Tian et al.

(10) Patent No.: US 12,243,605 B2
(45) Date of Patent: Mar. 4, 2025

(54) STORAGE SYSTEM AND METHOD FOR PROACTIVE DIE RETIREMENT BY FATAL WORDLINE LEAKAGE DETECTION

(71) Applicant: Western Digital Technologies, Inc., San Jose, CA (US)

(72) Inventors: Xuan Tian, Shanghai (CN); Liang Li, Shanghai (CN); Dandan Yi, Shanghai (CN); Jojo Xing, Shanghai (CN); Vincent Yin, Shanghai (CN); Yongke Sun, Shanghai (CN); Alan Bennett, Edinburgh (GB)

(73) Assignee: Sandisk Technologies, Inc., Milpitas, CA (US)

( * ) Notice: Subject to any disclaimer, the term of this patent is extended or adjusted under 35 U.S.C. 154(b) by 117 days.

(21) Appl. No.: 17/856,073

(22) Filed: Jul. 1, 2022

(65) Prior Publication Data
US 2024/0006010 A1  Jan. 4, 2024

(51) Int. Cl.
*G11C 29/42* (2006.01)
*G11C 29/12* (2006.01)
*G11C 29/44* (2006.01)

(52) U.S. Cl.
CPC .......... *G11C 29/42* (2013.01); *G11C 29/1201* (2013.01); *G11C 29/4401* (2013.01); *G11C 2029/1202* (2013.01)

(58) Field of Classification Search
CPC . G11C 29/42; G11C 29/1201; G11C 29/4401; G11C 2029/1202
See application file for complete search history.

(56) References Cited

U.S. PATENT DOCUMENTS

| | | | |
|---|---|---|---|
| 8,514,630 B2 * | 8/2013 | Huynh | G11C 29/028 365/185.21 |
| 9,105,349 B2 * | 8/2015 | Avila | G11C 29/04 |
| 9,202,593 B1 * | 12/2015 | Magia | G11C 11/5628 |
| 10,032,524 B2 * | 7/2018 | Sabde | G11C 29/025 |
| 10,248,515 B2 * | 4/2019 | Srinivasan | G06F 11/2094 |
| 11,366,714 B2 * | 6/2022 | Ilic | G06F 11/0793 |
| 2010/0271891 A1 | 10/2010 | Dell et al. | |
| 2014/0321202 A1 | 10/2014 | Yang et al. | |
| 2016/0012915 A1 | 1/2016 | Magia et al. | |
| 2019/0006021 A1 * | 1/2019 | Ghai | G11C 11/5628 |
| 2021/0182188 A1 | 6/2021 | Ilic | |
| 2021/0389901 A1 | 12/2021 | Pachamuthu et al. | |

* cited by examiner

*Primary Examiner* — Vanthu T Nguyen
(74) *Attorney, Agent, or Firm* — Crowell & Moring LLP (57) ABSTRACT

In some situations, a leak on a wordline may be a localized problem that causes data loss in a block that contains the wordline. In other situations, such as when the leak occurs near a peripheral wordline routing area, the leak can affect the entire memory die. The storage system provided herein has a fatal wordline leak detector that determines the type of leak and, accordingly, whether just the block should be retired or whether related blocks should be retired.

10 Claims, 9 Drawing Sheets

STORAGE SYSTEM AND METHOD FOR PROACTIVE DIE RETIREMENT BY FATAL WORDLINE LEAKAGE DETECTION

BACKGROUND

Single or multiple wordline shorts in a NAND memory array usually only cause data loss of a few pages. During a factory test of the memory, built-in self-test (BIST) leak detection modes can be used to screen-out leaky blocks and mark them as factory bad blocks (FBB). If any data loss happens due to wordline shorts in the field, the storage system can try to recover user data and, if that fails, can retire the block as a grown bad block (GBB) to prevent future usage. Some GBBs can degrade into a global fail in later usage and cause preemptive die retirement (PDR), which can impact performance.

DETAILED DESCRIPTION

The following embodiments generally relate to a storage system and method for proactive die retirement by fatal wordline leakage detection. In one embodiment, a method is provided that is performed in a storage system comprising a memory die. The method comprises: detecting a short in a wordline in a block in the memory die; determining whether the short in the wordline affects only the block or affects the memory die; in response to determining that the short in the wordline affects only the block, retiring the block without retiring the memory die; and in response to determining that the short in the wordline affects the memory die, retiring the memory die.

In another embodiment, a storage system is provided comprising a memory die; and a fatal wordline leak detector further configured to: determine whether a leak detected in a wordline in a block in the memory die affects only the block or the entire memory die; in response to determining that the leak affects only the block, mark only the block as bad, wherein other blocks in the memory die are available for use; and in response to determining that the leak affects the entire memory die, mark the entire die as bad.

In yet another embodiment, a storage system is provided comprising a memory die; means for detecting a short in a wordline in a block in the memory die; means for determining whether the short in the wordline affects only the block or affects the memory die; means for retiring the block without retiring the memory die in response to determining that the short in the wordline affects only the block; and means for retiring the memory die in response to determining that the short in the wordline affects the memory die.

Other embodiments are provided and can be used alone or in combination.

Figures 1A, 1B:
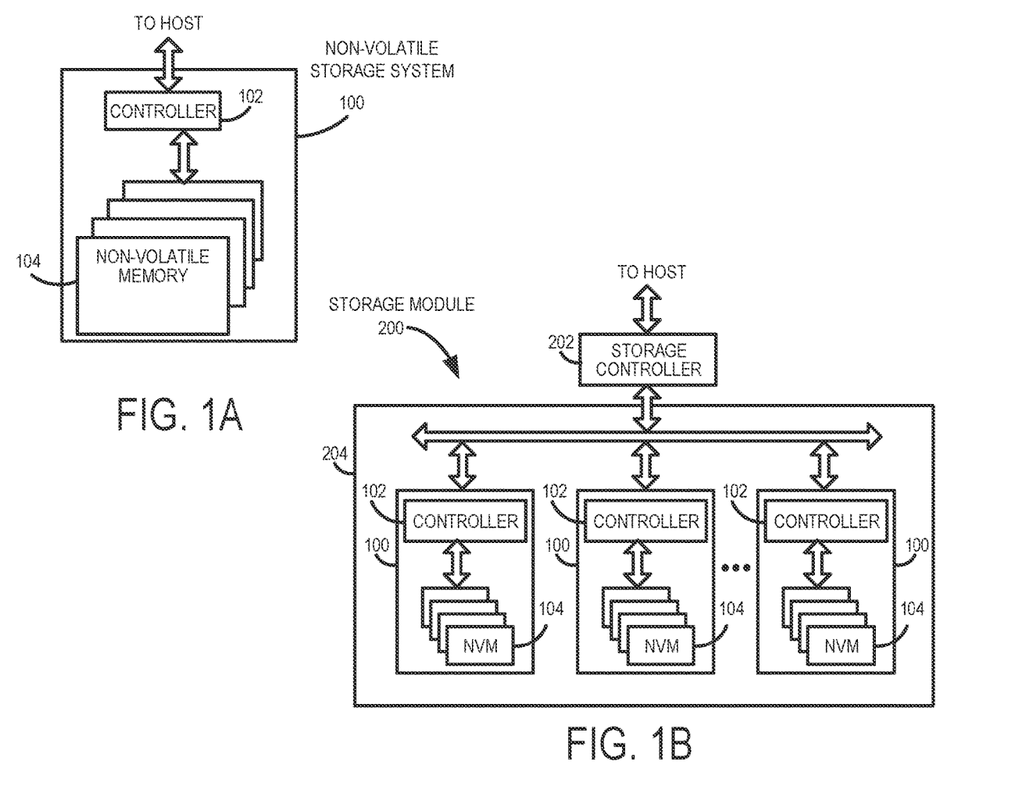
FIG. 1A is a block diagram of a non-volatile storage system of an embodiment.
FIG. 1B is a block diagram illustrating a storage module of an embodiment.
Figure 1C:
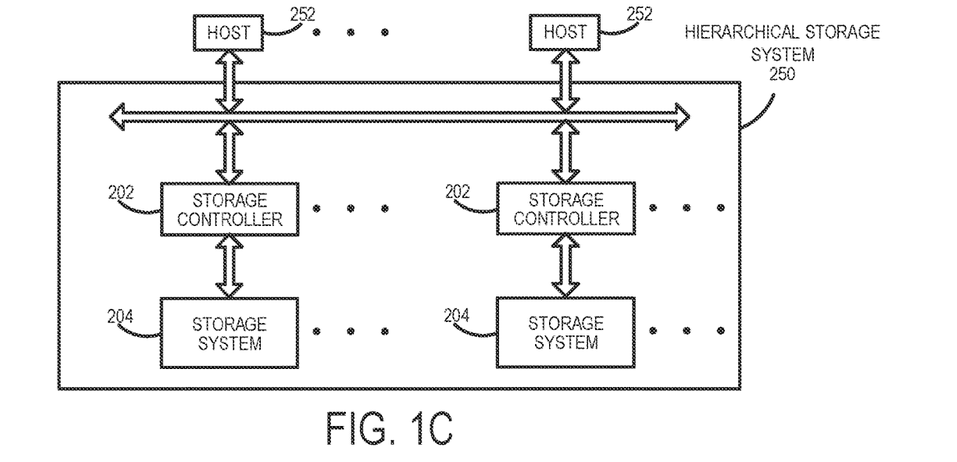
FIG. 1C is a block diagram illustrating a hierarchical storage system of an embodiment.

Turning now to the drawings, storage systems suitable for use in implementing aspects of these embodiments are shown in Figures IA-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level (one-bit per cell) cells (SLC) or multiple-level cells (MLC), such as two-level cells, triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
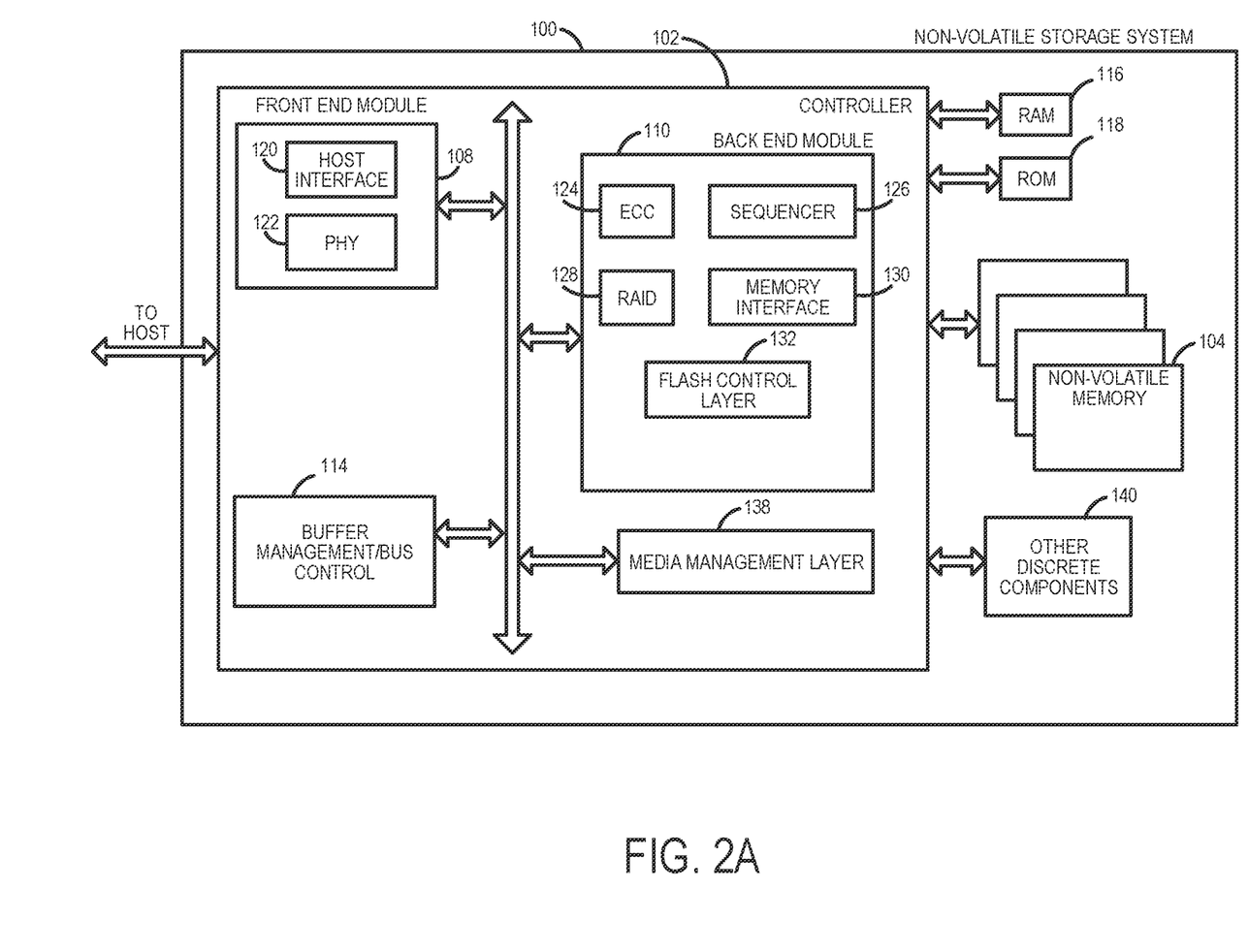
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 18 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
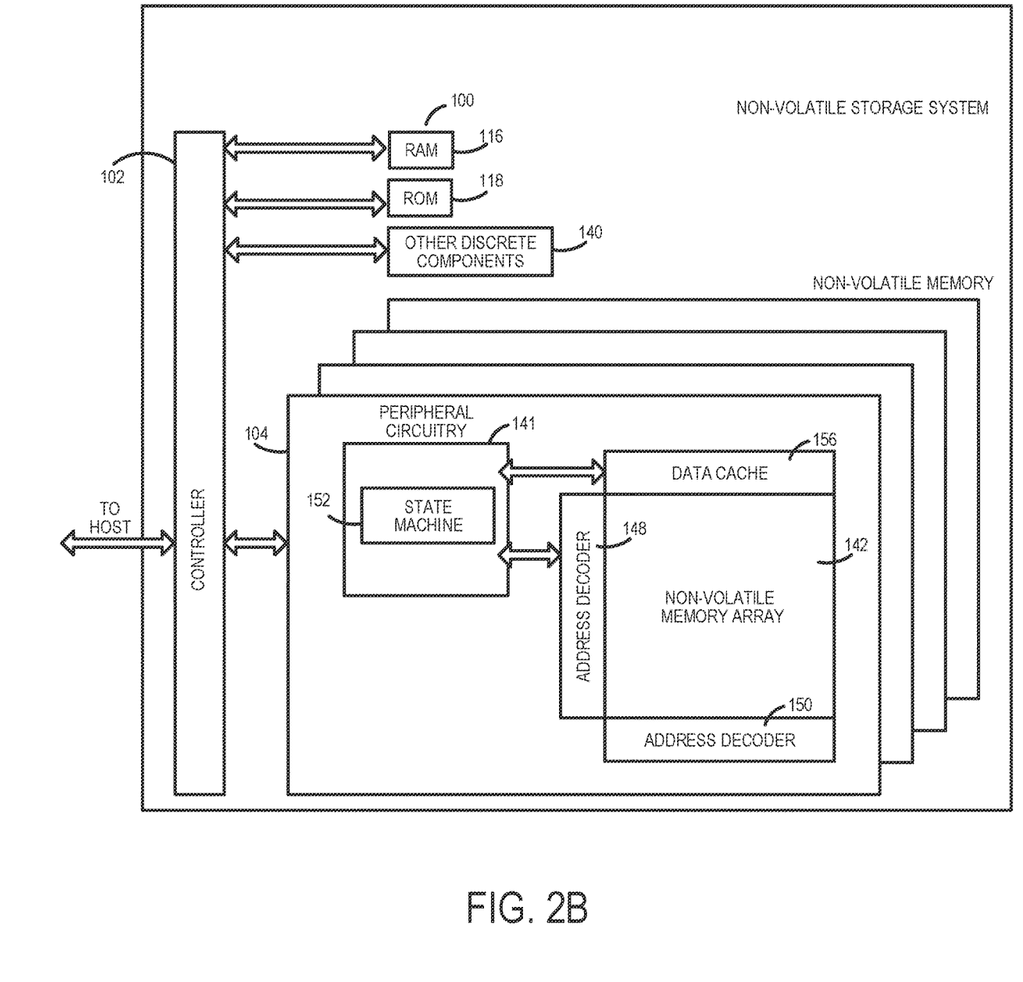
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
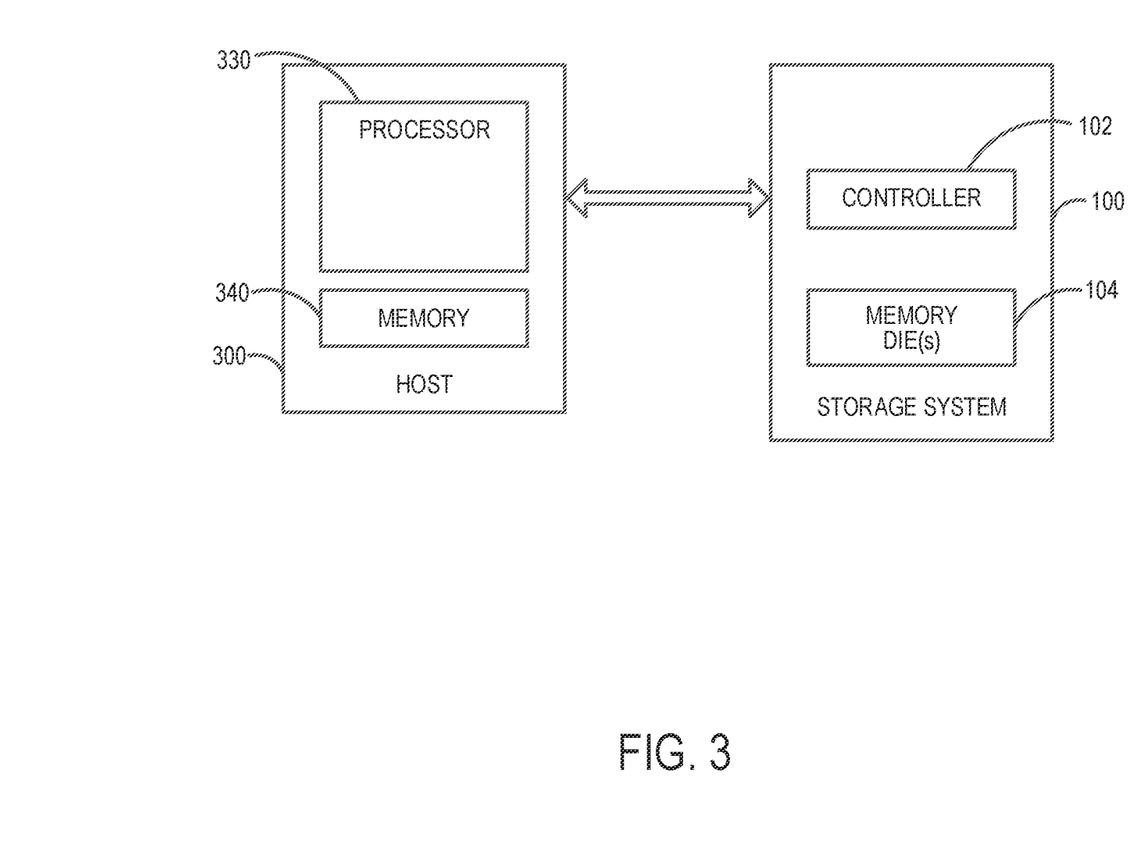
FIG. 3 is a block diagram of a host and storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

As mentioned above, single or multiple wordline shorts in a NAND memory array usually only cause data loss of a few pages. During a factory test of the memory, built-in self-test (BIST) leak detection modes can be used to screen-out leaky blocks and mark them as factory bad blocks (FBB). If any data loss happens due to wordline shorts in the field, the storage system can try to recover user data and, if that fails, can retire the block as a grown bad block (GBB) to prevent future usage.

However, unlike wordline shorts inside the array, wordline shorts at a peripheral wordline routing area can bring about a fatal plane/die-level failure during the lifetime of the memory. More specifically, if wordline shorts are close to a global control gate interface (CGI) area, fatal plane/die-level data loss can happen even if the shorted block has been marked as an FBB during a factory test or has been retired as a GBB by the storage system in the field. This is because the defected area can still be stressed during user operation, since the CGI is a global signal to the transfer gate of local wordlines, and it will be biased during a good block operation.

Figure 4:
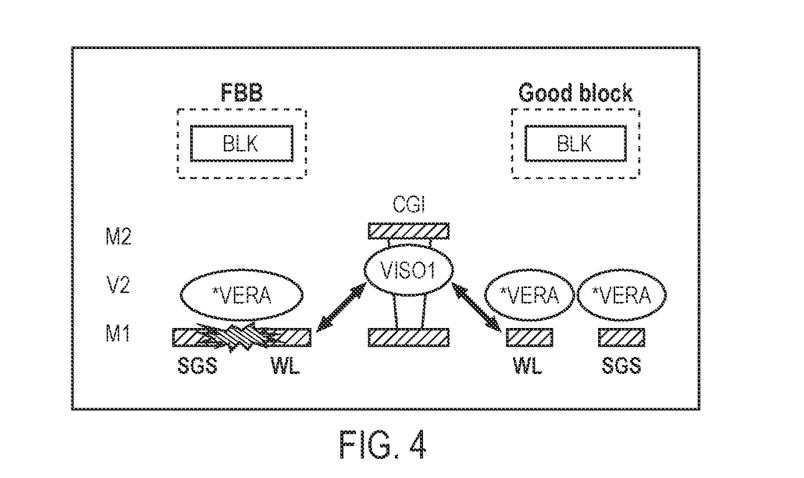
FIG. 4 is a schematic diagram of user erase stress of an embodiment.
Figure 5:
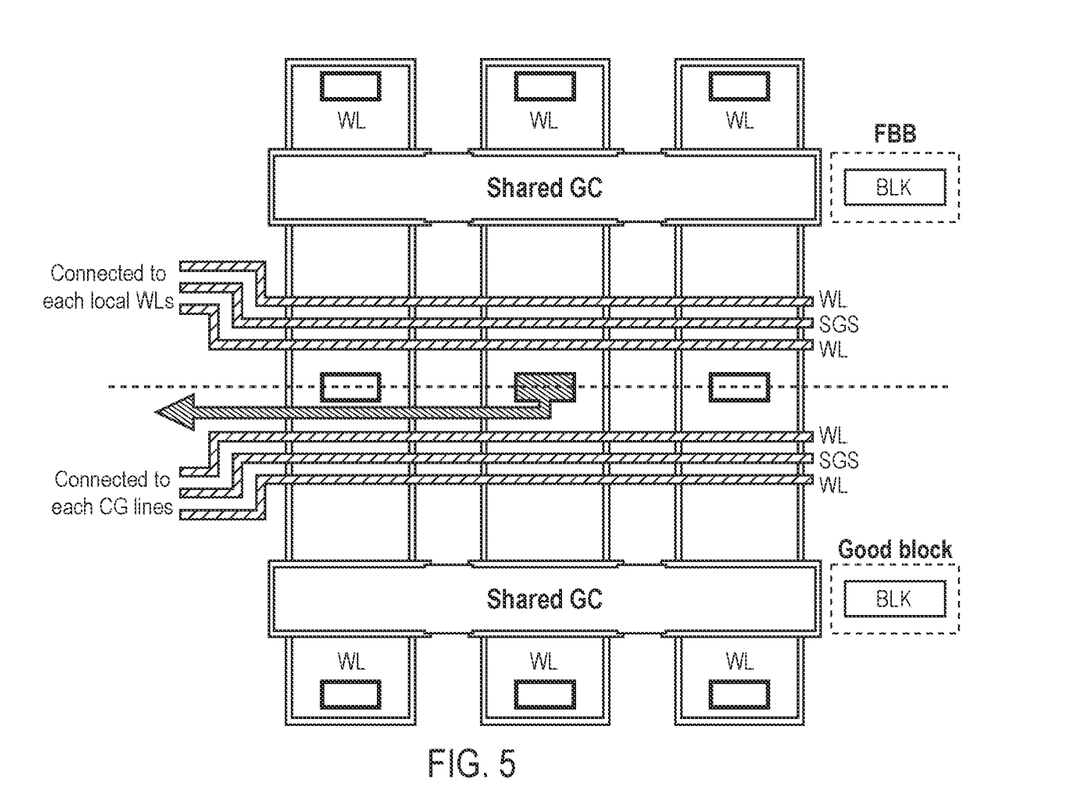
FIG. 5 is a top view of the schematic diagram of FIG. 4.

FIGS. 4 and 5 show a scenario where the local wordline and CGI are stressed during a user erase for good blocks. In this scenario, both blocks are unselected but share the same CGI with a selected block. The FBB had an SGS-WL short at M1. In this case, CGI is biased as an isolation voltage (VISO) (e.g., a very-low voltage, such as ~0.5V), and the local wordline of the bad block is coupled from the memory hole to a verification voltage (VERA) (e.g., a very-high voltage, such as ~18V). Therefore, as time goes on, the short can grow towards the CGI side and finally lead to a global CGI short.

For high-capacity products, such as enterprise storage systems, dies with massive GBBs will be preemptively retired if the GBB number exceed a criterion, typically 30 per type of failure (erase/program/read failure, GBB due to age retirement, etc.). Generally, a high GBB die implies a high-defect density. Thus, to reduce drive failure risk, strongly defective dies will be preemptively retired. Therefore, if a global CGI short happens on an enterprise product, XOR can be firstly triggered for data recover, then the die can be retired to avoid future usage according to a preemptive die retirement (PDR) feature. However, this can will cause some problems. For example, there can be a temporary performance drop due to strong system overhead from XOR recovery and due to data relocation because all valid data from the retired die needs to be moved to a good die. As another example, permanent overprovisioning (OP) loss can occur, which can degrade random write (RW) performance and increase an end-of-life (EOL) program/erase (P/E) requirement on other dies. Therefore, unnecessary PDR for such case can bring about undesirable system impact, as mentioned above.

General test modes for array leak detection do not specify any wordlines to be measured, as they measure leakage either for all wordlines or wordlines in groups (e.g., by even/odd wordlines or by different drivers). This leads to a dilemma that a block is judged to be leaky quickly by measuring all wordlines or grouped wordlines, but there is no opportunity to know which wordlines are leaky. This is especially true for the M1 defect discussed above, where retiring the die in customer usage or rejecting the die during a factory test is done instead of retiring a single block or marking it as an FBB.

Some test modes can specify the bias for each CG driver. However, there are still problems unsolved for the defect mode mentioned herein: (1) leakage detected between different CG groups is inevitable and (2) even for two specific CG groups, it is hard to determine the shorted wordlines. Besides, such mode can become ineffective when two shorted wordlines come from the same CG group. Therefore, there is no good way to detect specific wordline shorts and retire/reject the die if the short is located at a critical area, such as close to a global CGI contact.

The following embodiments can be used to address this problem. In one embodiment, a new algorithm is provided using fatal wordline leak detection (F-WLLD). The F-WLLD mode can be used to accurately detect a potential CGI short, so that related blocks can be proactively marked bad, instead of retiring a whole die (because one global CGI short will only impact one common CGI block). After a GBB event, F-WLLD can be executed on the GBB during system background time to avoid a memory performance penalty. If F-WLLD fails, all valid data from one common CGI block will be transferred to other good blocks, then those blocks will be retired to avoid future usage. Therefore, GBBs with fatal wordline leakage will not degrade to a massive GBB event. Thus, unnecessary PDR will be avoided. This feature can be used in any suitable memory and may be especially desired for high-capacity memory products, such as enterprise storage systems. For example, a loss of one or multiple dies may be allowed for a high-capacity (e.g., 32/64/128 dies) drive within its lifetime depending on the specification of system performance drop. So, proactively retiring a die can effectively avoid a fatal plane/die-level data loss for the system if the fatal wordline leakage is detected on a GBB.

Figure 6:
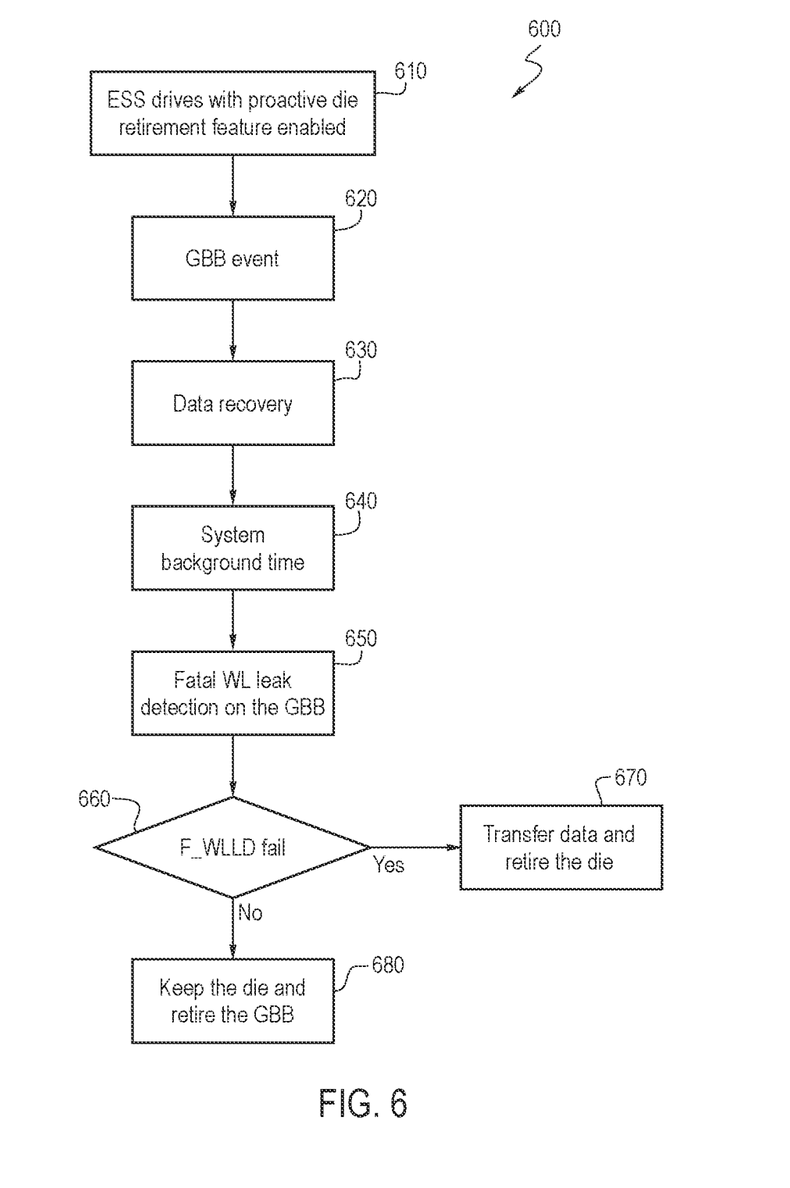
FIG. 6 is a flow chart of a method of an embodiment for proactive die retirement.

FIG. 6 is a flowchart 600 of a proactive die retirement method of an embodiment. As shown in FIG. 6, the storage system 100 (here, an enterprise storage system (ESS), but any type of storage system can be used) has its proactive die retirement feature enabled (act 610). After a GBB event (act 620), the fatal wordline leak detection F-WLLD mechanism is executed on the GBB (e.g., during system background time to avoid a NAND performance penalty) (acts 630, 640, 650). A determination is then made to see if F-WLLD failed (act 660). If F-WLLD failed, data is transferred from the bad die to other good die(s), and the die is retired from future usage (act 670). In this way, GBBs with fatal wordline leakage will not degrade to a plane/die-level failure. However, if F-WLLD was successful, the die is kept, and the GBB is retired (act 680).

Figure 7:
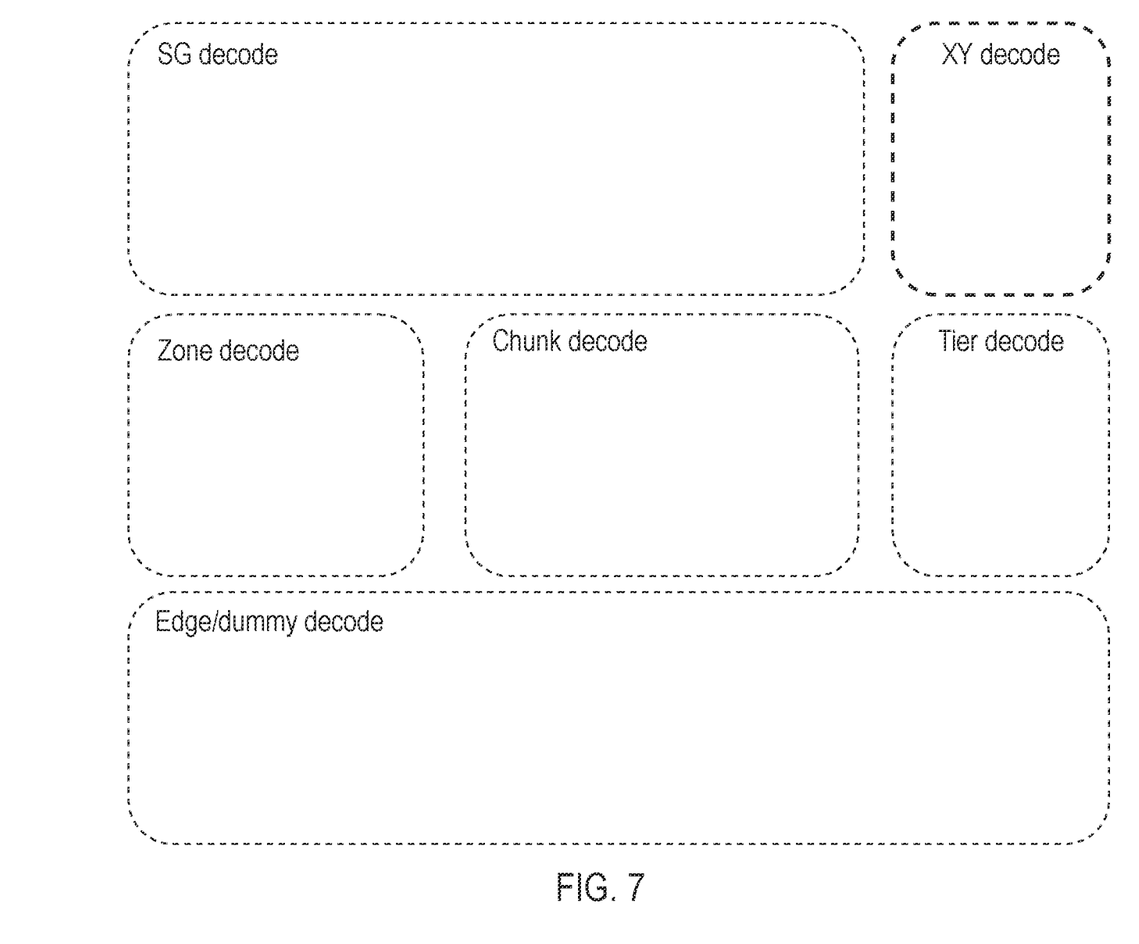
FIG. 7 is a diagram of a high-voltage switch (HVSW) of an embodiment.

FIG. 7 shows a schematic of a high-voltage switch (HVSW) of an embodiment. As shown in FIG. 7, the HVSW of this embodiment comprises a SG decode module, an XY decode module, a zone decode module, a chunk decode module, a tier decode module, and an edge/dummy decode module. In a normal WLLD mode, voltages are passed to the SG and data and dummy wordlines through different CG drivers. However, this may not give the flexibility of independent bias on each wordline, as discussed above. To address this, in this embodiment, the XY decode circuit is enabled in F-WLLD mode. Here, CGX and CGY are CG drivers to provide different biases to WL1~110 in F-WLLD mode. In this mode, all HVSW gate signals for the zone, chunk, and tier decode are off, and only XY decode, SG decode, and edge/dummy wordline decode are working. In XY decode, G_CGX_SW and G_CGY_SW in each wordline can be independently turned on or off based on the input wordline address for high and low bias.

Figure 8:
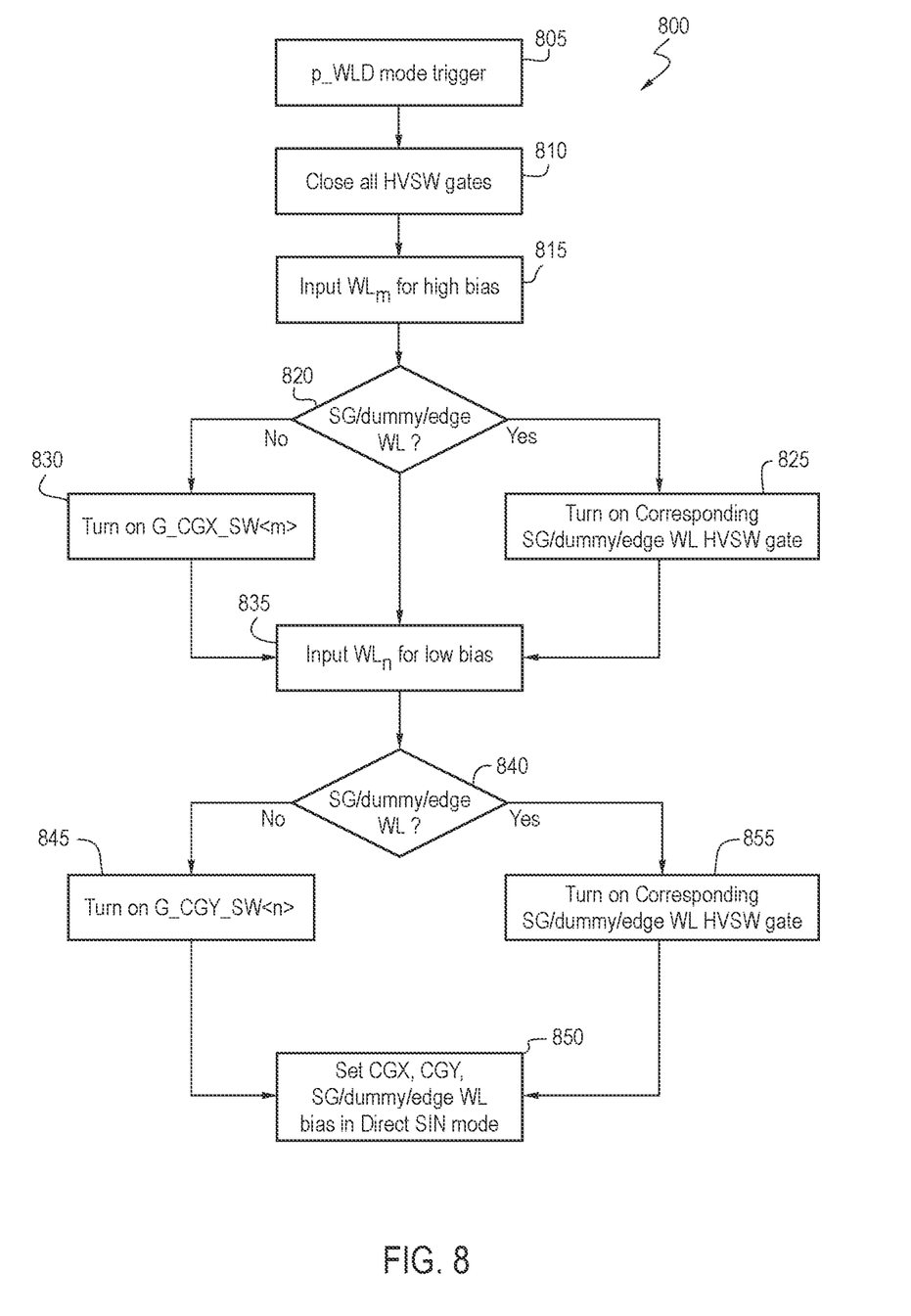
FIG. 8 is a flow chart of a method of an embodiment for high-voltage switch gate specification.

FIG. 8 is a flow chart 800 that illustrates this process. As shown in FIG. 8, in response to a F_WLLD mode trigger (act 805), all HVSW gates are closed (act 810), and W Lm is input for a high bias (act 815). A determination is then made regarding whether it is a SG, dummy wordline, or edge wordline (act 820). If it is, the corresponding SG, dummy wordline, or edge wordline HVSW gate is turned on (act 825). If it is not, G_CGX_SW<m> is turned on (act 830), and input WLn is set for low bias (act 835). Then, a determination is made regarding whether it is a SG, dummy wordline, or edge wordline (act 840). If it is, the corresponding SG/dummy/edge WL HVSW gate is turned on (act 855), and CGX, CGY, SG/dummy/edge WL bias is set in direct SIN mode (act 850). If it is not, G_CGX_SW<n> is turned on (act 845), and CGX, CGY, SG/dummy/edge WL bias is set in direct SIN mode (act 850). Therefore, in F-WLLD mode, only two given wordlines, including SG and edge/dummy wordlines, will get high and low bias from the XY decoder and the SG and edge/dummy decoders, respectively. All other non-selected wordlines will be floating.

Considering the variance of metal routing for different generations, the F-WLLD mode is also layout adaptive. For example, the M1 wordline pairs running close to CGI contacts are risky wordlines, so any dies with those wordline pairs shorted can be retired/rejected. In some layouts, only four wordline pairs are next to global CGIs. Looping all four wordline pairs in F-WLLD mode, the risk of fatal plane/die-level data loss by a global CGI short would be greatly suppressed. For other layouts, wordline routing close to CGI could be different, but the wordline pairs for F-WLLD mode can be prestored in firmware after checking specific product layout. This is illustrated in the flow chart 900 in FIG. 9.

Figure 9:
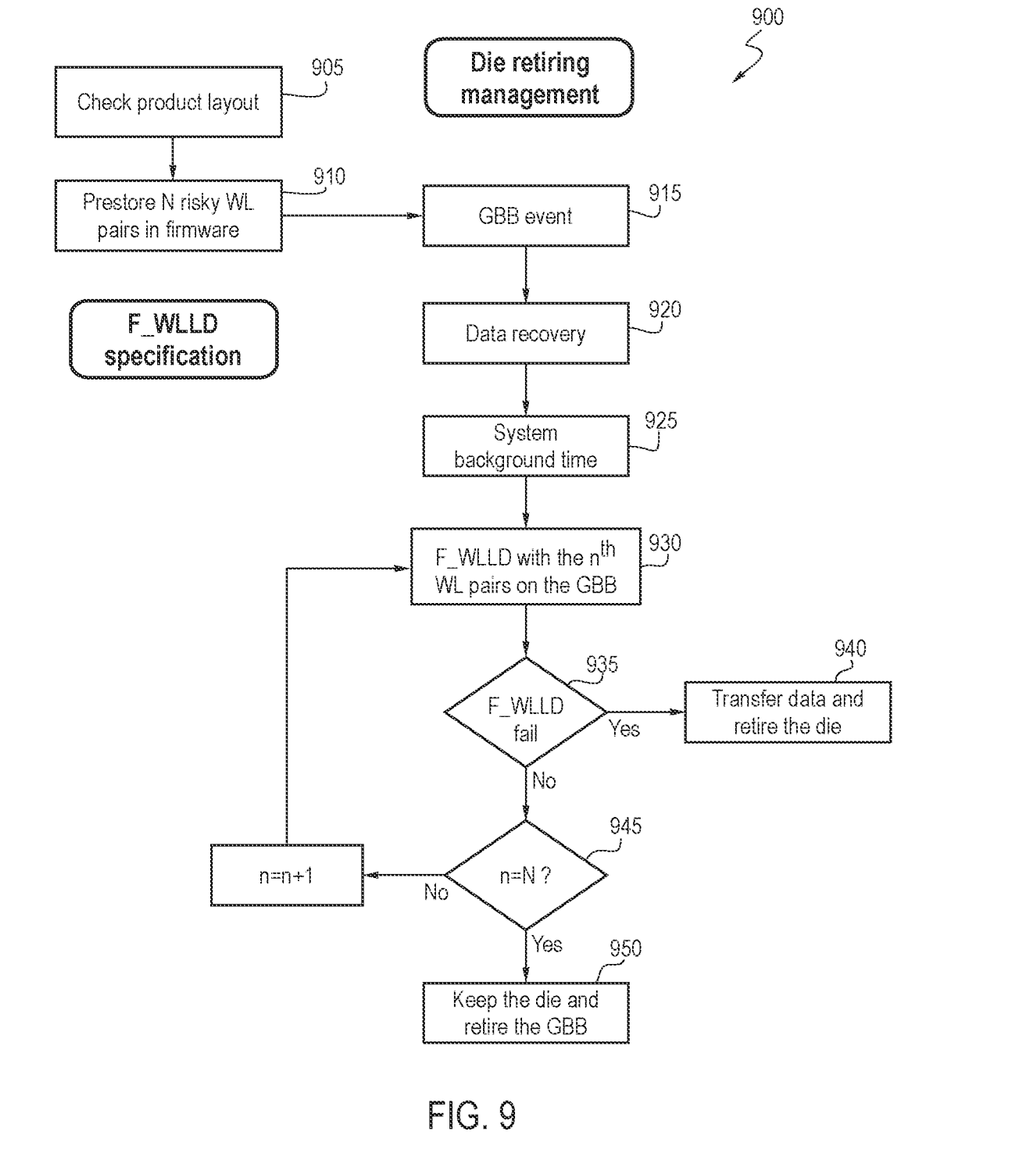
FIG. 9 is a flow chart of a method of an embodiment for managing die retirement.

As shown in FIG. 9, after the product layout is checked (act 905), N number (any positive integer) of risky wordline pairs can be prestored in firmware (act 910). After a GBB event occurs (act 915) and after data recovery and system background time (acts 920, 925), F_WLLD occurs on the nth wordline pairs on the GBB (act 930). A determination is then made regarding whether F_WLLD failed (act 935). IF F_WLLD failed, the data is transferred, and the die is retired (act 940). If F_WLLD did not fail, a determination is made whether n=N (act 945). If it does, the die is kept, and the GBB is retired (act 950). If it does not, n is increased by 1 (act 955), and the method loops back to act 930.

There are several advantages associated with these embodiments. For example, these embodiments present a new feature of proactive die retirement using a fatal wordline leak detection, which can avoid fatal plane/die-level data loss. Also, this new GBB management algorithm using fatal wordline leak detection can avoid unnecessary PDR for enterprise storage systems, which provides benefits for the system. For instance, these embodiments can limit performance impact because they proactively retire related blocks without any data loss. So, the time-consuming and heavy XOR recovery is not needed. Additionally, only part of a block's data needs to be relocated, which is much less-intensive than the current PDR design. Further, in some situations, these embodiments can provide a more than 80% overprovisioning loss saving. Since these embodiments can only retire one common CGI block, most array blocks can still be kept for overprovisioning or user capacity. This significant overprovisioning loss saving can help mitigate read/write performance degradation and reduce the extra erase/program cycle requirement on other good dies. Also, these advantages can come without a NAND performance penalty (because they can work in system background time) and with a negligible increase in die size.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. In a storage system comprising a memory die, a method comprising:

detecting a grown bad block (GBB) in the memory die in response to detecting a wordline short;

performing fatal wordline leak detection on the detected grown bad block by independently biasing each wordline in the detected grown bad block to identify a location of the wordline short, wherein in performing the fatal wordline leak detection, at a given time, only two wordlines receive low and high biases from XY decode circuitry in a high-voltage switch and all other wordlines are floating;

in response to identifying the location of the wordline short as being in a memory array of the memory die, which corresponds to a success of the fatal wordline leak detection:

transferring data out of the detected grown bad block; and retiring the detected grown bad block but not the memory die; and in response to identifying the location of the wordline short as being in a peripheral wordline routing area of the memory die that is susceptible of a control gate interface (CGI) short, which corresponds to a failure of fatal wordline leak detection:

transferring data out of the detected grown bad block and other blocks in the memory die; and retiring the memory die.

2. The method of claim 1, wherein the fatal wordline leak detection is performed during system background time.

3. The method of claim 1, wherein the fatal wordline leak detection is performed as part of a built-in self-test.

4. The method of claim 1, further comprising attempting to recover data lost in the detected grown bad block.

5. The method of claim 1, wherein the memory die comprises a three-dimensional memory.

6. A storage system comprising:
a memory die; and
a fatal wordline leak detector configured to:
detect a grown bad block (GBB) in the memory die in response to detecting a wordline short;

perform fatal wordline leak detection on the detected grown bad block by independently biasing each wordline in the detected grown bad block to identify a location of the wordline short, wherein in performing the fatal wordline leak detection, at a given time, only two wordlines receive low and high biases from XY decode circuitry in a high-voltage switch and all other wordlines are floating;

in response to identifying the location of the wordline short as being in a memory array of the memory die, which corresponds to a success of the fatal wordline leak detection:

transfer data out of the detected grown bad block; and retire the detected grown bad block but not the memory die; and in response to identifying the location of the wordline short as being in a peripheral wordline routing area of the memory die that is susceptible of a control gate interface (CGI) short, which corresponds to a failure of fatal wordline leak detection:

transfer data out of the detected grown bad block and other blocks in the memory die; and retire the memory die.

7. The storage system of claim 6, wherein the memory die comprises a three-dimensional memory.

8. The storage system of claim 6, wherein the storage system comprises an enterprise storage system comprising a plurality of memory dies.

9. A storage system comprising:
a memory die;
means for:
detecting a grown bad block (GBB) in the memory die in response to detecting a wordline short;

performing fatal wordline leak detection on the detected grown bad block by independently biasing each wordline in the detected grown bad block to identify a location of the wordline short, wherein in performing the fatal wordline leak detection, at a given time, only two wordlines receive low and high biases from XY decode circuitry in a high-voltage switch and all other wordlines are floating;

in response to identifying the location of the wordline short as being in a memory array of the memory die, which corresponds to a success of the fatal wordline leak detection:

transferring data out of the detected grown bad block; and retiring the detected grown bad block but not the memory die, and in response to identifying the location of the wordline short as being in a peripheral wordline routing area of the memory die that is susceptible of a control gate interface (CGI) short, which corresponds to a failure of fatal wordline leak detection:

transferring data out of the detected grown bad block and other blocks in the memory die; and retiring the memory die.

10. The method of claim 1, wherein the storage system comprises an enterprise storage system comprising a plurality of memory dies.

* * * * *